US007648855B2

(12) United States Patent
Gillot et al.

(10) Patent No.: US 7,648,855 B2
(45) Date of Patent: Jan. 19, 2010

(54) DEVICE COMPRISING AN ENCAPSULATED MICROSYSTEM AND PRODUCTION METHOD THEREOF

(75) Inventors: Charlotte Gillot, Voiron (FR); Nicolas Sillon, Fontaine (FR); Emmanuelle Lagoutte, St Marcellin (FR)

(73) Assignee: Commissariat a l'Energie Atomique, Paris (FR)

( * ) Notice: Subject to any disclaimer, the term of this patent is extended or adjusted under 35 U.S.C. 154(b) by 277 days.

(21) Appl. No.: 11/573,207

(22) PCT Filed: Aug. 10, 2005

(86) PCT No.: PCT/FR2005/050665

§ 371 (c)(1),
(2), (4) Date: Feb. 5, 2007

(87) PCT Pub. No.: WO2006/092474

PCT Pub. Date: Sep. 8, 2006

(65) Prior Publication Data

US 2008/0067655 A1 Mar. 20, 2008

(30) Foreign Application Priority Data

Aug. 13, 2004 (FR) .................................. 04 51848

(51) Int. Cl.
*H01L 21/44* (2006.01)
*H01L 21/48* (2006.01)
*H01L 21/50* (2006.01)

(52) U.S. Cl. ................ 438/106; 438/125; 257/E21.499
(58) Field of Classification Search ................ 257/678, 257/704, 710, 724, E23.127, E23.18, E23.193, 257/E21.499; 438/106, 107, 121, 125
See application file for complete search history.

(56) References Cited

U.S. PATENT DOCUMENTS

| 5,504,026 | A | 4/1996 | Kung |
| 6,012,336 | A | 1/2000 | Eaton et al. |
| 6,087,701 | A | 7/2000 | Bergstrom et al. |
| 6,174,820 | B1 | 1/2001 | Habermehl et al. |
| 6,352,935 | B1 | 3/2002 | Collins et al. |
| 2005/0067179 | A1 * | 3/2005 | Stark .................. 174/52.4 |

FOREIGN PATENT DOCUMENTS

| EP | 0 525 764 A2 | 2/1993 |
| EP | 1 101 730 A2 | 5/2001 |
| FR | 2 849 016 | 6/2004 |

* cited by examiner

*Primary Examiner*—Hoai V Pham
(74) *Attorney, Agent, or Firm*—Oblon, Spivak, McClelland, Maier & Neustadt, L.L.P.

(57) ABSTRACT

A process for manufacturing a device including a packaged microsystem. The manufactured device is in a form of a plane wafer, the microsystem being buried in the wafer. Therefore, the process is used to make a compound that may be used as a basis for other micro technology processes. Moreover, the process co-integrates electronic compounds when the device is being manufactured. The device is particularly suitable for MEMS, and particularly radiofrequency resonators.

20 Claims, 3 Drawing Sheets

DEVICE COMPRISING AN ENCAPSULATED MICROSYSTEM AND PRODUCTION METHOD THEREOF

TECHNICAL DOMAIN

The invention relates to the domain of microdevices, particularly electromechanical microsystems (MEMS) that are isolated in hermetically sealed cavities.

In particular, the invention relates to a process for manufacturing such a MEMS to obtain a plane device that can therefore be used as a manufacturing support. The process according to the invention can also be used to integrate other components into the device.

The invention also relates to plane devices comprising a packaged MEMS, that can be manufactured using this process.

STATE OF PRIOR ART

Electromechanical microsystems, actuators or sensors are being increasingly developed. In many cases, the active component is preferably isolated in a cavity hermetically sealed to gas and humidity, for example so as to limit aging or to increase the reliability o measurements. It may also be desirable to control the atmosphere inside the cavity, for example using a neutral gas in order to prevent any chemical reaction or to seal the cavity under a more or less high vacuum. Creation of these cavities, in other words encapsulation of microsystems (better known under the term "packaging") is thus essential for the development of the microdevices.

Packaging may be done at the scale of the device, for example with the chip being placed in a hermetically sealed package. However, this option is relatively expensive and limits miniaturisation of assemblies.

Another possibility that is becoming more widespread relates to packaging on the scale of the substrate. It is thus possible to use a cap transferred by hermetic sealing around the microsystem. Another option is to make a sealed cavity around the microsystem using appropriate surface technologies, this option being known under the term "thin layer packaging".

For example, this technique is described in documents EP-A-0 525 764 and EP-A-1 101 730, and is shown diagrammatically in FIG. 1: a microsystem 1, in this case a beam comprising a sacrificial material 2 on one face is placed on a substrate 3, and a sacrificial material 2' is then put into place to identify the cavity and the release channel 4 (FIG. 1A). A packaging material 5 is then deposited on the sacrificial material 2'. The sacrificial materials 2, 2' are etched (FIG. 1B) to release the beam. Finally, a material 6 such as SiN is deposited to close off the cavity (FIG. 1C) and from the microdevice 7.

However, the passage of occasionally thick conductors 8 (for example 1 µm thick) from inside the cap towards the outside can cause problems for coverage by the closing layer 6: for example Plasma Enhanced Chemical Vapour Deposition (PECVD) does not cover very well, and the run pass is often defective.

The main disadvantage of this technique remains the strong topology generated by the packaging cap 5, 6 thus created. It might be interesting to manufacture new components on the same device 7, for example a capacitance on a radiofrequency resonator. This requires a plane wafer, in other words a device 7 with no topology, namely a so-called "buried" MEMS.

PRESENTATION OF THE INVENTION

The invention proposes to overcome the disadvantages of existing techniques. In particular, the invention proposes a solution to bury a MEMS type device in a cavity, particularly a hermetically sealed cavity, possibly under a vacuum. The invention also relates to a technology to co-integrate other components, for example radiofrequency coils, in a device for which the microsystem is packaged.

According to one of its aspects, the invention relates to a manufacturing process including the placement of sacrificial materials on a substrate to delimit one or more cavities, packaging of the sacrificial material by a layer thicker than the first height, and palanarisation of this packaging layer that can then be covered by a packaging cap layer. In particular, the packaging layer may be one and an half times thicker than the sacrificial material, and it may be composed of silicon oxide or nitride, or a bi-layer of these materials.

Advantageously, planarisation of the packaging layer is accompanied by thinning, particularly such that the sacrificial material is also "planarised" and thinned. The assembly is then covered by a packaging cap in the form of a layer, for example with the prior creation of channels of sacrificial material to reach the cavities.

Preferably, several cavities are formed by the sacrificial material, at least one of them comprising a microsystem.

The cavities are formed by etching of the sacrificial material, that can be done successively depending on the destination of the cavity. In particular, a cavity intended for a co-integrated system may be released in advance. An electrolytic growth, for example of copper, can then be done and the compound thus created can then be planarised and the assembly can be covered with a passivation layer.

The cavity comprising the microsystem may then be released, and then closed off by depositing a coating layer, possibly including putting under a controlled atmosphere.

According to another aspect, the invention relates to a microdevice that may nave been made using the process described above. In particular, the device according to the invention is in the form of a wafer, in other words it has a plane surface opposite the substrate and it comprises a cavity, the atmosphere of which can be controlled, containing a microsystem such as a resonator. The cavity is delimited on its sidewalls by a material, for example $SiO_2$, forming a layer with a homogenous thickness on the surface of the substrate. Preferably, the wall of the cavity opposite the substrate is composed of a material forming another layer with uniform thickness.

Advantageously, the layer of material forming the walls of the cavity also comprises other electronic compounds forming the microdevice, such as coils or inductances.

BRIEF DESCRIPTION OF THE FIGURES

The special features and advantages of the invention will be better understood after reading the description given below with reference to the appended figures given for illustrative purposes and that are in no way limitative.

DETAILED PRESENTATION OF PARTICULAR EMBODIMENTS

Figure 1A:
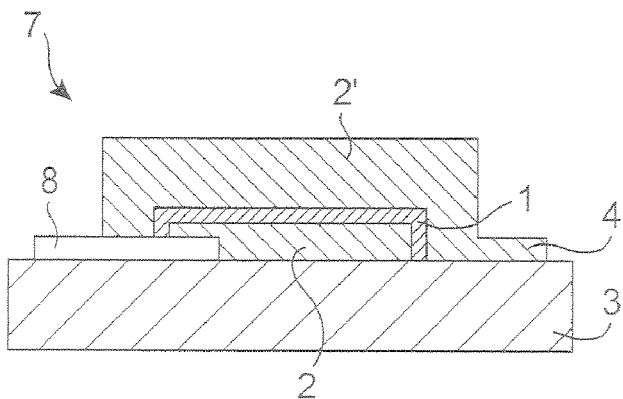
FIGS. 1A-1C, already described, diagrammatically represent a process for manufacturing a packaged resonator according to the state of the art.

The process according to the invention consists mainly of covering the sacrificial material that will form the cavity with a thick layer, and particularly an oxide, followed by thinning accompanied by planarisation, for example using a CMP (chemical-mechanical planarisation) process.

More precisely, the process according to a preferred embodiment of the invention may be described with reference to FIG. 2.

A microsystem 10, particularly an electromechanical microsystem, is firstly made on a support 12, for example a silicon substrate. As shown schematically on FIG. 2A, the MEMS 10 may comprise a sacrificial layer 14 made of a photoresist designed to release the two faces of the MEMS; it could be a radiofrequency or BAW (bulk acoustic wave) filter resonator in the form of a beam or other, but the MEMS may include any known compounds such as micro sensors or micro actuators.

The substrate 12 may be a single layer or it may consist of a stack of several layers of different materials. It may or may not comprise electronic components (integrated circuits, inductances) on the surface. Advantageously, it has a plane face on the surface (except for openings necessary for making contact); it may comprise cavities at the locations at which the microsystems 10 are made.

Figure 2A:
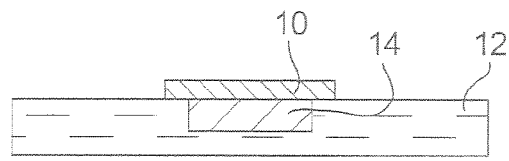
FIGS. 2A-2E show a manufacturing process according to the invention.
Figure 2B:
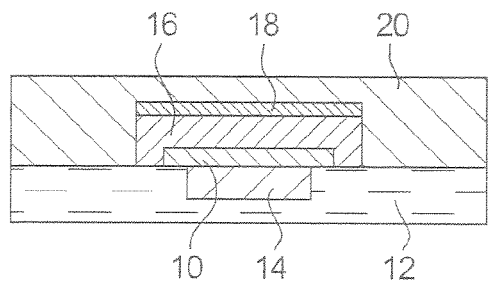
Figure 2C:
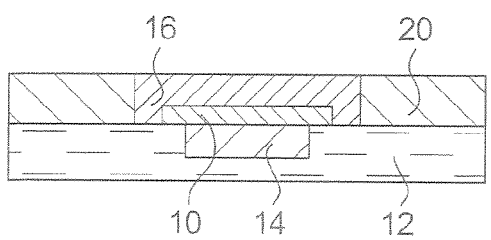

The sacrificial material 16 that will form the cavity is then put into place as shown in FIG. 2B. One of the possibilities may for example consist of depositing a polymer layer, with a first thickness of 5 μm, for example, corresponding to or greater than the height of the cavity of the MEMC 10, over the entire substrate 12, and then rebaking it, for example at 350° C. A hard mask 18, for example made of a metal such as tungsten, is deposited to cover the cavity and the layer is etched to leave only the sacrificial material 16 that will form the cavity packaging the MEMS 10. However, the use of the hard mask 18 is not compulsory, and depending on the case the sacrificial layer 16 can be etched directly using photolithography techniques.

The packaging or coating layer 20 is then put into place. Advantageously, the thickness of the packaging layer 20 is about 1.5 to 1.7 times the thickness of the layer of sacrificial material 16. The deposit may then be made using conventional techniques; it may be uniform over the entire thickness or it may form a bi-layer. Advantageously, the packaging layer 20 is composed of $SiO_2$ or SiN or a $SiN/SiO_2$ bi-layer, for example about 8 μm thick.

The packaging layer 20 is then "planarised", for example using a chemical-mechanical process. This planarisation is preferably accompanied by thinning of the coating layer 20. Advantageously, thinning is done until the sacrificial resin 16 is reached, the mask 18 thus being eliminated. As a variant, thinning may begin by chemical-mechanical polishing and be continued by dry etching. In particular, this step can be continued until reaching a compound shown diagrammatically in FIG. 2C, the thickness of the sacrificial material 16 being equal to the height of the required cavity, and for which the surface opposite the substrate 12 is plane.

Preferably, the next step is formation of a channel that will be used for etching the sacrificial material 16. To achieve this, a thin layer (for example 300 nm thick) of a polymer, possibly the same as the polymer from which the sacrificial material 16 is made, is deposited and then baked at 350° C. Lithoetching is done to only keep the material to be used for the channel 22. This channel 22 facilitates subsequent closing off of the cavity, but is not compulsory.

Figure 2D:
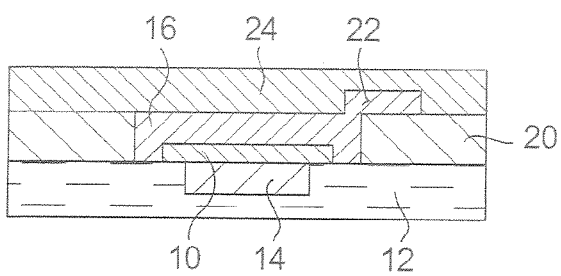

A second packaging layer or cap 24 can then be deposited (FIG. 2D). It may be the same material as the first material 20; the layer 24 may be 1 to 3 μm thick, and for example be composed of $SiO_2$ or SiN.

Figure 2E:
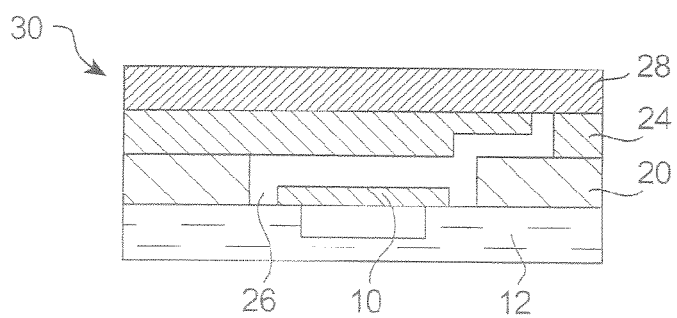

The MEMS cavity can then be "released" as shown in FIG. 2E. For example, the cap 24 is drilled, advantageously offset from the future cavity, and the various sacrificial materials (of the channel 22, the cavity 16 and the MEMS 14) are etched, for example by oxygen plasma. The cavity 26 thus created may be put under a controlled atmosphere (inert gas or vacuum) and closed off by depositing a layer of material 28 such as a metal, $SiO_2$ or SiN. These two steps may be performed simultaneously, the deposit being done under a controlled atmosphere that is required in the cavity.

The microdevice 30 according to the invention thus comprises a substrate 12, a layer of a first material 20 or which the surface opposite the substrate 12 is plane. A hermetically sealed cavity 26 comprises a MEMS 10; it is delimited on the bottom by the substrate 12 and/or the MEMS 10, or the side by sidewalls made of a first material 20 cod on the top by a top wall composed either of the first material 20 or a second material that forms a layer 24 on the plane surface of the first material 20.

Figure 1B:
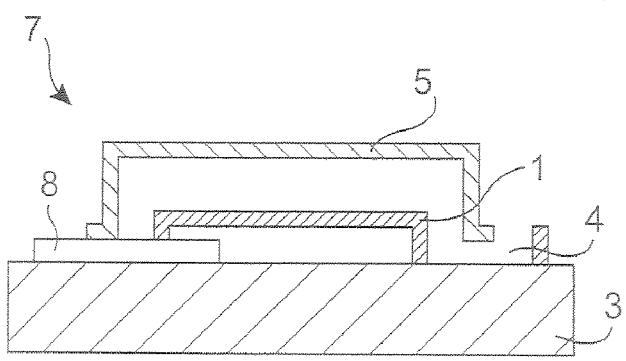
Figure 1C:
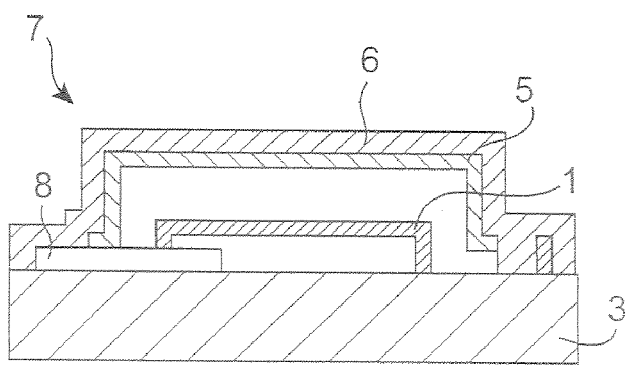

The microsystem 10 is packaged in the device 30 and the topology of this device 30 is zero, in other words the device 30 is plane (its packaging surface is parallel to the substrate 12). This aspect is maintained even if there are any conductors present (see FIG. 1); these conductors are embedded in the thick layer 20 and cannot disturb closing of the device 30, nor placement of the cap 24, 28. It is thus possible to use the device 30, for example as a substrate in other microelectronic processes.

Furthermore, other microelectronic compounds can be put into place in the device 30; these other structures can be manufactured before the cavity 26 is released, in other words while the MEMS 10 is protected by the sacrificial resin 14, 16. In particular, other structures can be integrated while the device 30 is being manufactured; it thus becomes possible to co-integrate inductances or thick electrical tracks, which is particularly advantageous when the packaged MEMS 10 is a radiofrequency device of the switch, variable inductance or resonator type.

We will now describe one of the preferred processes for this co-integration with reference to FIG. 3.

The MEMS 10' is positioned on the substrate 12', the sacrificial layer 16' may be deposited in the same way as in the process described in FIG. 2. However, in the process being described now, the hard mask 18' is plural such that etching of the sacrificial layer 16' allows some zones shown diagrammatically in FIG. 3A to subsist: part of the sacrificial layer 16' will form the cavity containing a controlled atmosphere around the MEMS 10', but the resin also defines second cavities 32, 34, for example designed to hold thick conductors and/or inductances. Obviously, it would be possible to have several cavities 26' for use with identical or different MEMSs 10'.

Although the second sacrificial zones 32, 34 can be made in the same layer of sacrificial material 16', it is clear that several successive placements could also be adopted so as to obtain regions with different natures.

Figure 3A:
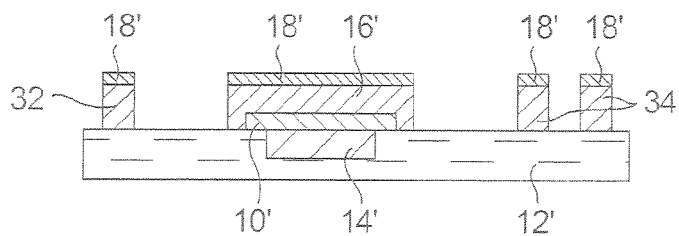
FIGS. 3A-3D represent a variant for a preferred embodiment of a device according to the invention.
Figure 3B:
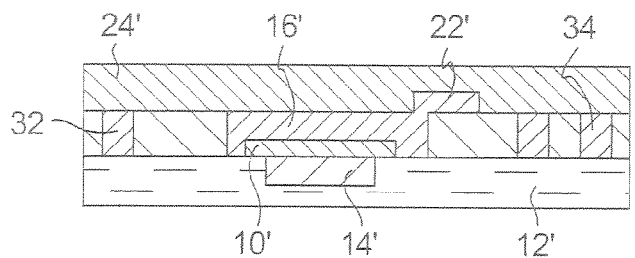

The process is then continued as described above, for example as far as the step shown in FIG. 2D; the device in FIG. 3B comprises a substrate 12' on which a MEMS 10' is positioned in a cavity filled with sacrificial material 16'. There is a plane layer of packaging material 20' on the substrate 12' through which zones 16', 32, 34 of sacrificial material pass. The assembly is covered by a packaging cap 24' in which there is a channel 22' of sacrificial material.

Figure 3C:
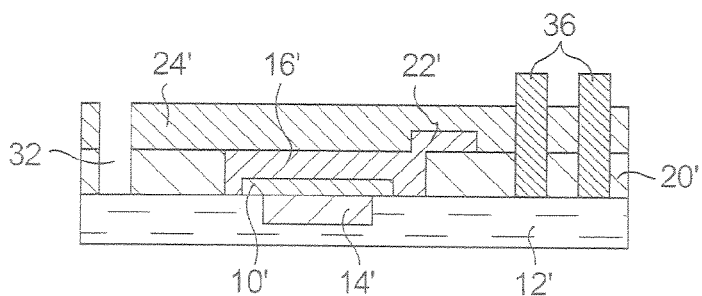

At this stage, it is possible to preferentially open the second cavities 32, 34 and etch the sacrificial material in them while keeping the MEMS cavity in its state full of sacrificial material 16'. The second cavities 32, 34 can then be provided with their electronic compounds (FIG. 3C). For example, electrolytic growth 36 of a metal, for example such as copper, can be used to form a coil, or to deposit a material so as to form a thick conductor. These steps may be done simultaneously or sequentially depending on the nature of the compound to be produced and all usual techniques for placement and/or manufacturing can be used.

Once the compounds 36 and 38 are in place in the cavities 32, 34, planarisation is repeated, for example using a CMP process. The surface is then passivated 40, particularly on conductors 38 and inductances 36, for example by deposition of $SiO_2$.

The process can then be continued as described above for creating a controlled atmosphere in the cavity surrounding the MEMS 10': drilling of the assembly composed of the passivation layer 40 and the cap 24', etching of the resin 14', 16', closing by deposition of a layer 42.

Figure 3D:
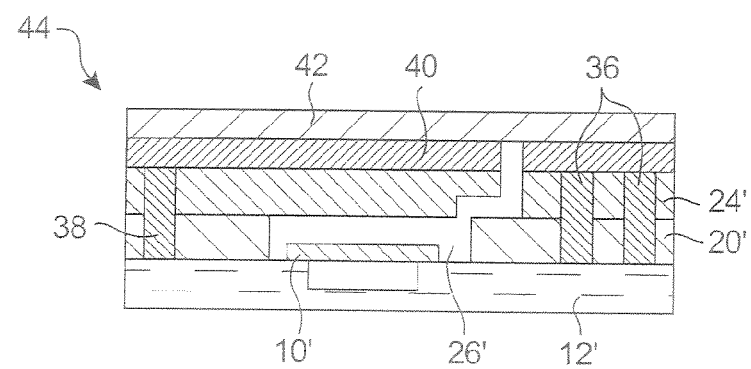

The device 44 in FIG. 3D thus has a buried MEMS 30' and integrated compounds 36, 38 and is in the form of a plane wafer. With the process according to the invention, the number of steps to make the device 44 with zero topology is smaller than in existing processes. Furthermore, compatibility between manufacturing steps of each of the components no longer causes any problem, which correspondingly simplifies the process and opens up prospects for associations of different MEMS.

The invention is most particularly applicable to radiofrequency electromechanical microsystems, and to micro sensors and micro actuators. The invention also includes other conventional alternatives of this type of device.

Figure 4:
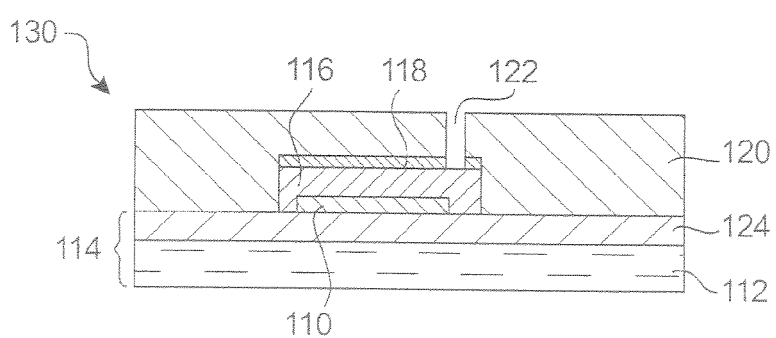
FIG. 4 represents another embodiment of a device according to the invention.

For example, although the device 130 according to the invention has been described with a microsystem 10 positioned directly on the substrate 12, it should be understood that with this invention, the microsystem 110 can be positioned on any usual support 114, such as a prepared substrate 112 that for example has been coated in advance with an oxide layer 124, possibly similar to the packaging layer 120: see FIG. 4.

Similarly, it is not necessary that thinning opens up onto the sacrificial material 116; in this case, a channel 122 will be provided in the packaging material 120 (and the mask 118 if there is one) to enable elimination of the sacrificial material. The mask 118 does not need to have been destroyed during planarisation of the encapsulation layer 120, and a hole can pass through it to eliminate the sacrificial material 116. This hole may be closed off after the sacrificial material 116 has been eliminated if it is required to control the atmosphere in the cavity.

The invention claimed is:

1. A process for manufacturing a device with a zero topology on its packaging surface opposite to a support including a microsystem packaged in a cavity with a first height, comprising:
    supplying the microsystem onto a support;
    local positioning a sacrificial material intended to form at least the cavity;
    depositing a packaging layer onto the support and the sacrificial material;
    planarizing the surface of the packaging layer opposite to the support; and
    creating a packaging top wall at the top of the cavity, parallel to the support and composed either of a first planarized material of the packaging layer or a second material that forms a layer on the planarized surface of the first planarized material of the packaging layer.

2. A manufacturing process set forth in claim 1, comprising thinning the packaging layer.

3. A manufacturing process set forth in claim 1, followed by depositing a plane packaging cap.

4. A manufacturing process set forth in claim 1, further comprising thinning the packaging layer and the sacrificial material and depositing a packaging cap for which the surface opposite to the substrate is plane.

5. A manufacturing process set forth in claim 4, in which the thinning is followed by placing a channel of a second sacrificial material towards the sacrificial material intended to form the cavity, the packaging cap being thicker than the channel so as to have a plane surface.

6. A manufacturing process set forth in claim 4, in which the packaging cap is of a same material as the packaging layer.

7. A manufacturing process set forth in claim 1, in which the sacrificial material is placed by depositing a layer of sacrificial material with a first thickness at least equal to a first height of the cavity followed by etching the sacrificial material.

8. A manufacturing process set forth in claim 7, further comprising placing a mask on the sacrificial material before etching the sacrificial material 9. A manufacturing process set forth in claim 1, in which the thickness of the packaging layer is at least one and a half times the thickness of the sacrificial material.

10. A manufacturing process set forth in claim 1, in which the packaging layer is composed of $SiO_2$, SiN, or an $SiO_2$/SiN bi-layer.

11. A manufacturing process set forth in claim 1, in which the sacrificial material put into place is also intended to form at least one second cavity.

12. A manufacturing process set forth in claim 11, followed by etching the sacrificial material of the second cavities.

13. A manufacturing process set forth in claim 12, followed by placing microelectronic elements in the second cavities.

14. A manufacturing process set forth in claim 13, in which at least one microelectronic element is put into place by electrolytic growth of metal in one of the second cavities.

15. A manufacturing process set forth in claim 13, further comprising planarizing the surface of the device formed opposite to the support, said surface comprising microelectronic elements in the second cavities.

16. A manufacturing process set forth in claim 15, followed by depositing a passivation layer on the planarized surface comprising microelectronic elements in the second cavities.

17. A manufacturing process set forth in claim 1, followed by etching the sacrificial material intended for the cavity.

18. A manufacturing process set forth in claim 17, following by putting the cavity under a controlled atmosphere.

19. A manufacturing process set forth in claim 18, in which the cavity is put under a controlled atmosphere simultaneously with depositing a material to close off the cavity.

20. A manufacturing process set forth in claim 17, further comprising depositing a material to close off the cavity.

* * * * *